United States Patent
Djonin et al.

(10) Patent No.: US 11,506,713 B2
(45) Date of Patent: Nov. 22, 2022

(54) CONFIGURING AN ANALOG GAIN FOR A LOAD TEST

(71) Applicant: VIAVI Solutions Inc., San Jose, CA (US)

(72) Inventors: Dejan Djonin, Vancouver (CA); Nestor Siu, New Westminster (CA); Hamidreza Boostanimehr, Vancouver (CA)

(73) Assignee: VIAVI Solutions Inc., San Jose, CA (US)

( * ) Notice: Subject to any disclaimer, the term of this patent is extended or adjusted under 35 U.S.C. 154(b) by 71 days.

(21) Appl. No.: 17/247,161

(22) Filed: Dec. 2, 2020

(65) Prior Publication Data

US 2021/0080502 A1 Mar. 18, 2021

Related U.S. Application Data

(63) Continuation of application No. 16/140,063, filed on Sep. 24, 2018, now Pat. No. 10,859,629.

(51) Int. Cl.
| | |
|---|---|
| *G01R 31/00* | (2006.01) |
| *G01R 31/319* | (2006.01) |
| *G01R 31/28* | (2006.01) |
| *G01R 35/00* | (2006.01) |

(52) U.S. Cl.
CPC ..... *G01R 31/3191* (2013.01); *G01R 31/2832* (2013.01); *G01R 35/005* (2013.01)

(58) Field of Classification Search
USPC ..................................... 324/76.11, 750.02
See application file for complete search history.

(56) References Cited

U.S. PATENT DOCUMENTS

| | | | |
|---|---|---|---|
| 7,286,802 B2 | 10/2007 | Beyme et al. | |
| 8,278,940 B2 | 10/2012 | Bartlett et al. | |
| 9,813,379 B1* | 11/2017 | Shevade | H04L 63/0272 |
| 10,859,629 B2 | 12/2020 | Djonin et al. | |
| 2006/0141937 A1* | 6/2006 | Creigh | H04B 17/20 |
| | | | 455/67.11 |
| 2009/0059012 A1 | 3/2009 | Noguchi et al. | |
| 2019/0312761 A1* | 10/2019 | Shulman | H04L 27/0002 |

OTHER PUBLICATIONS

VIA VI Solutions Inc., "CapacityAdvisor 9400 for LTE: Next Generation Capacity and Performance Testing Platform," https://www.viavisoltions.com/en-us/products/capasityadviosor-9400-lte, Nov. 19, 2015, 3 pages.

* cited by examiner

*Primary Examiner* — Vincent Q Nguyen
(74) *Attorney, Agent, or Firm* — Harrity & Harrity, LLP

(57) ABSTRACT

A device may determine an analog gain for an aggregated analog signal. The aggregated analog signal may be associated with a calibration test to be used to determine a set of calibration parameters for a load test of a base station. The device may determine the set of calibration parameters for the load test based on an outcome of performing a calibration test. The set of calibration parameters may result in a set of digital gains approximately centered in a digital dynamic gain range. The device may perform the load test after determining the analog gain for the analog signal and based on the set of calibration parameters for the load test.

20 Claims, 9 Drawing Sheets

CONFIGURING AN ANALOG GAIN FOR A LOAD TEST

RELATED APPLICATION

This application is a continuation of U.S. patent application Ser. No. 16/140,063, filed on Sep. 24, 2018 (now U.S. Pat. No. 10,859,629), the contents of which is incorporated by reference herein in its entirety.

BACKGROUND

Load testing is the process of modeling an expected usage of computing resources by simulating a demand for the computing resources, such as simulating a quantity of simultaneous users of the computing resources. Load testing facilitates measurement of the computing resources' quality of service performance based on expected customer behavior. To perform a load test, a tester may emulate users, devices, and/or the like.

SUMMARY

According to some possible implementations, a method may comprise: aggregating, by a device, a set of digital signals to form an aggregated digital signal for a calibration test, wherein the aggregated digital signal emulates a set of user devices, wherein the calibration test is associated with determining a set of calibration parameters for a load test of a base station using the set of user devices; performing, by the device, a conversion of the aggregated digital signal to an aggregated analog signal; determining, by the device, an analog gain for the aggregated analog signal; performing, by the device, the calibration test based on the analog gain for the aggregated analog signal; and determining, by the device, the set of calibration parameters for the load test based on an outcome of performing the calibration test.

According to some possible implementations, a device may comprise: one or more memories; and one or more processors, communicatively coupled to the one or more memories, configured to: aggregate a set of digital signals to form an aggregated digital signal for a calibration test, wherein the aggregated digital signal emulates a set of user devices, wherein the calibration test is associated with determining a set of calibration parameters for a load test of a base station using the set of user devices; determine a value of an analog gain for an aggregated analog signal based on aggregating the set of digital signals, wherein the aggregated digital signal is converted to the aggregated analog signal; perform the calibration test based on the analog gain for the aggregated analog signal; and determine the set of calibration parameters for the load test based on an outcome of performing the calibration test.

According to some possible implementations, a non-transitory computer-readable medium may store instructions, the instructions comprising: one or more instructions that, when executed by one or more processors, cause the one or more processors to: determine an analog gain for an aggregated analog signal, wherein the aggregated analog signal is associated with a calibration test to be used to determine a set of calibration parameters for a load test of a base station; perform the calibration test after determining the analog gain for the aggregated analog signal; determine the set of calibration parameters for the load test based on an outcome of performing the calibration test; and perform the load test based on the set of calibration parameters for the load test.

DETAILED DESCRIPTION

The following detailed description of example implementations refers to the accompanying drawings. The same reference numbers in different drawings may identify the same or similar elements.

A software defined radio (SDR) may be used to emulate a set of user devices for a load test. The SDR may utilize a fixed analog gain (e.g., radio frequency (RF) gain), and may utilize digital gains to adjust a respective transmit gain of the set of user devices used during the load test. Configuring an optimal analog gain for the SDR may be difficult and/or inaccurate. For example, the SDR may need information related to an external RF loss between the SDR and a base station to configure the optimal analog gain. If the SDR does not configure the optimal analog gain correctly, then the set of user devices that are being emulated may experience suboptimal uplink decode performance. In addition, the load test may not be capable of emulating the throughputs that are requested and/or needed for the load test. Further, during a load test, if channel modeling and/or power control are included in setup of the load test, then simulated digital gains of the set of user devices may change during the load test. Modification of the optimal analog gain based on these changes may not be possible utilizing current techniques for a load test.

Some implementations described herein provide a SDR that is capable of configuring an analog gain for a load test between a set of user devices that the SDR is emulating and a base station, such that the analog gain can be adjusted after a calibration test based on digital gain values measured during the calibration test. In this way, the SDR can adjust RF gain for the set of user devices individually and/or more accurately to allow for different channels, such that each channel has a threshold amount of RF gain. This improves a load test via more accurate and/or dynamic selection of an analog gain for the load test and/or of digital gains for the load test. In addition, this improves an efficiency of a load test via automatic uplink transmission power calibration for a SDR equipped with transmitters tuned prior to the load test, that are used to generate traffic for the set of user devices for the load test, that are used to emulate realistic radio channel conditions, and/or the like. Further, this facilitates calibration of a load test without information that identifies an external RF loss between the SDR and a base station, thereby improving performance of the load test.

Further, this facilitates use of a maximal dynamic range for digital gains for the set of user devices, thereby improving performance of the load test.

Figure 1A:
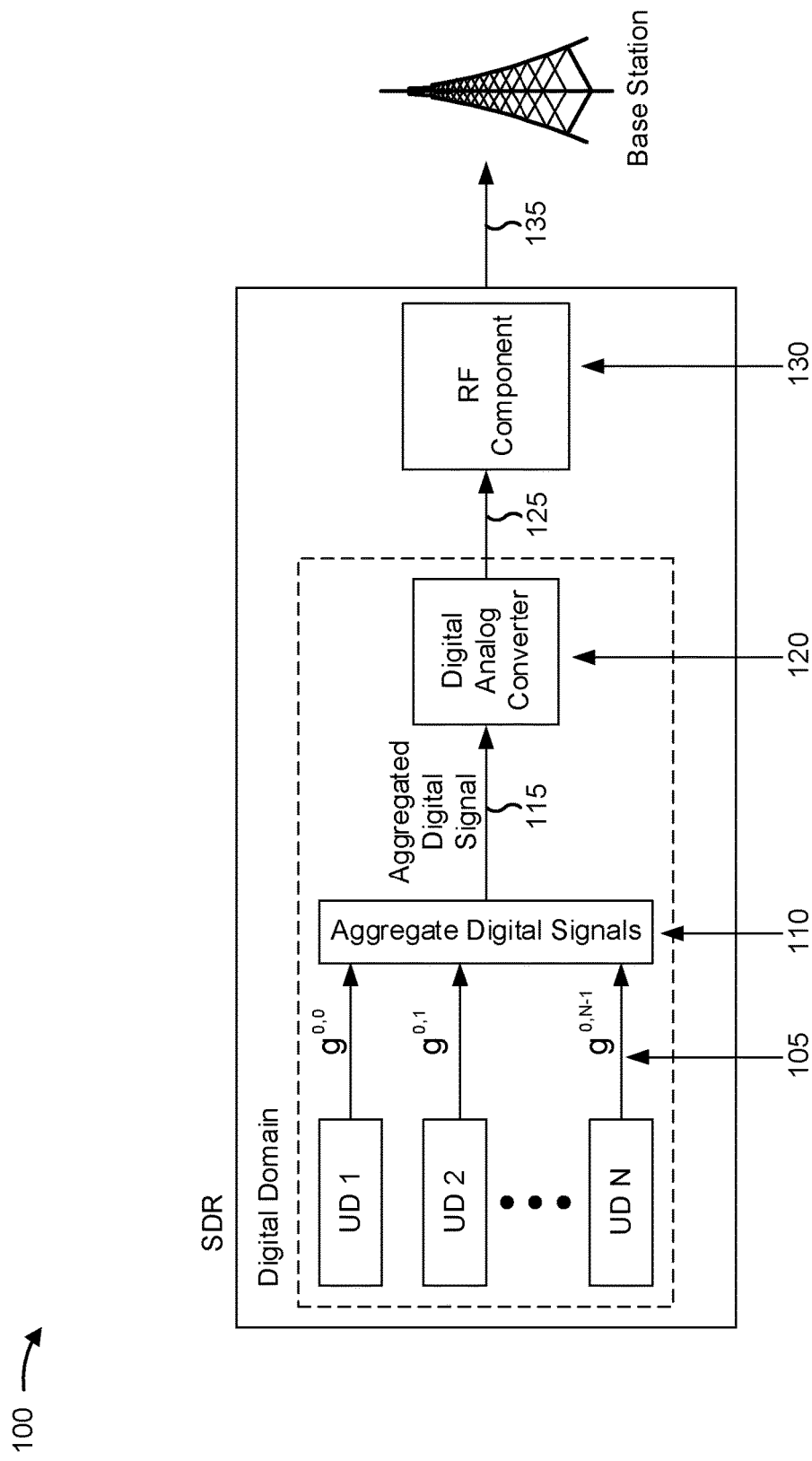
FIGS. 1A-1B are diagrams of an example implementation described herein.
Figure 1B:
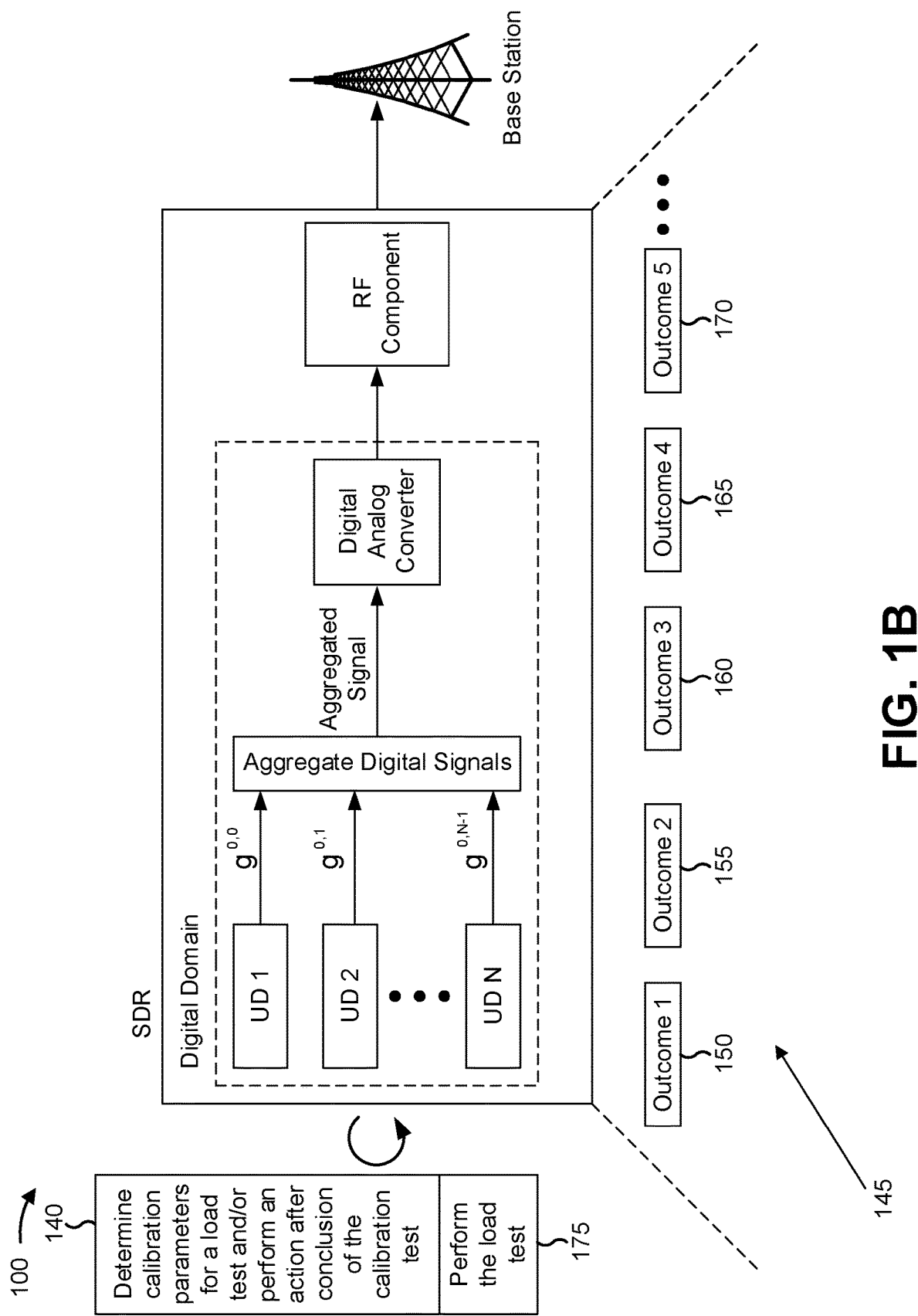

FIGS. 1A-1B are diagrams of an example implementation 100 described herein. As shown by FIG. 1A, implementation 100 includes a SDR and a base station. Implementation 100 describes the SDR and the base station performing a calibration test to determine calibration parameters for a load test. In some implementations, the calibration test may be subject to a set of design constraints. For example, the calibration test may include a set of user devices (e.g., a set of user devices emulated by the SDR), the set of user devices may attempt to establish a connection with the base station to establish a connected state, and the calibration test may be performed for an amount of time that is sufficient for a power control algorithm implemented by the base station to settle the digital gains of uplink physical channels to a long-term converged digital gain of the set of user devices. Additionally, or alternatively, assume for implementation 100 that the SDR lacks information identifying an external RF attenuation between the SDR and the base station at the time of configuration of the various gains described herein.

As shown in FIG. 1A, the SDR may include a digital domain. In some implementations, the digital domain may be associated with emulating a set of user devices (e.g., UD 1 through UD N) for the calibration test and/or for the load test. In some implementations, a user device may be associated with a simulated digital gain applied in the digital domain. For example, the SDR may generate a digital signal to emulate transmission by a user device, and may apply digital gain to this digital signal during the calibration test and/or the load test. In some implementations, the set of user devices may include multiple user devices. This may increase a confidence level and/or an accuracy of the calibration test.

In some implementations, if the set of user devices includes multiple user devices, the emulated actions of the set of user devices may be staggered so that the set of user devices establish a desired traffic flow in a delayed manner (e.g., without overwhelming the SDR and/or the base station in an unrealistic manner). In some implementations, if the calibration test is associated with an interference-limited uplink wireless scheme, such as a wideband code division multiple access (WCDMA) scheme, the SDR may perform the calibration test such that the set of user devices have a stable-state traffic pattern. This facilitates maximization of a dynamic range of digital gains for the calibration test (e.g., the dynamic range is described in more detail elsewhere herein).

As further shown in FIG. 1A, the digital domain may include a digital analog converter. In some implementations, the digital analog converter may convert a digital signal generated for the set of user devices to an analog signal to be transmitted to the base station, as described elsewhere herein.

As shown in FIG. 1A, and by reference number 105, the SDR may generate a respective digital signal for the set of user devices for an uplink channel to emulate the set of user devices. For example, the SDR may generate a respective digital signal for a first user device for a set of uplink channels, a respective digital signal for a second user device for the set of uplink channels, and so forth. In some implementations, the digital signals that the SDR generates may have a respective digital gain. For example, the SDR may generate digital signals with a respective digital gain after selecting the respective digital gain for the digital signals. In some implementations, the digital gain applied to the set of user devices (e.g., nominal gain to be applied to a digital signal at a start of the calibration test for a physical uplink channel) may be represented by the equation:

$$g^{i,j}$$

where j is the physical uplink channel (e.g., j=1, . . . , M), and i identifies a user device (e.g., 0 for user device (UD) 1, 1 for UD 2, and so forth). In some implementations, the nominal digital gain range for UD 1 is the interval [$g_{min}$, $g_{max}$], where $g_{min} = {}^{min}_j(g^{0,j})$ and $g_{max} = {}^{max}_j(g^{0,j})$.

In some implementations, the SDR may select nominal gains $g_0^j$ for a channel as the average long-term gains for that channel across all user devices associated with a load test. For example, this may be represented by the condition:

$$g_0^j = E[g_\infty^{i,j}]$$

where $E[g_\infty^{i,j}]$ is the average long-term gain across a set of user devices for a channel.

In some implementations, when selecting a respective digital gain for the digital signals, the SDR may select different digital gains for different physical uplink channels (e.g., for long-term evolution (LTE) systems, channels such as a physical random access channel (PRACH), a physical uplink control channel (PUCCH), a physical uplink shared channel (PUSCH), an uplink channel for a sounding reference signal (SRS), and/or the like). In some implementations, the SDR may select a digital gain within a dynamic range [$g_{low}$, $g_{high}$]. For example, the dynamic range may be defined by fixed point precision limitations of the digital domain of the SDR and may be configured by default, by a user of the SDR, and/or the like prior to selection of the digital gain. In some implementations, the dynamic range may be based on an actual physical implementation of an uplink data path between the SDR and the base station (e.g., by limits on the digital gain permitted on the uplink data path between the SDR and the base station). In some implementations, a size of the dynamic range may be represented by the equation:

$$D = 10 \log_{10}(g_{high}/g_{low})[dB]$$

where D is the size of the dynamic range [$g_{low}$, $g_{high}$], [$g_{low}$, $g_{high}$] is the dynamic range, $g_{high}$ is the maximum of the dynamic range, $g_{low}$ is the minimum of the dynamic range, and dB indicates the units, decibels, for the size of the dynamic range.

As shown by reference number 110, the SDR may aggregate digital signals generated to emulate the set of user devices. For example, the SDR may aggregate the digital signals generated to emulate the set of user devices to form an aggregated digital signal. In some implementations, the SDR may aggregate a respective digital gain for the digital signals (e.g., into an aggregated digital gain) when aggregating the digital signals. In some implementations, the SDR may aggregate the digital signals after generating the digital signals, based on receiving input from a user of the SDR to aggregate the digital signals, in subsets (e.g., may aggregate a first subset after the first subset is generated, may aggregate a second subset after the second subset is generated, and so forth), and/or the like.

As shown by reference number 115, the SDR may provide the aggregated digital signal to the digital analog converter. For example, the SDR may provide the aggregated digital signal to the digital analog converter after aggerating the digital signals generated to emulate the set of user devices. In some implementations, the SDR may provide the aggregated digital signal at a particular time after forming the aggregated digital signal, based on receiving input to provide the aggregated digital signal to the digital analog converter, and/or the like.

As shown by reference number 120, the SDR may utilize the digital analog converter to convert the aggregated digital signal to an aggregated analog signal. For example, the digital analog converter may convert the aggregated digital signal to an aggregated analog signal after receiving the aggregated digital signal. In some implementations, the SDR may utilize the digital analog converter to convert the aggregated digital signal into a form that the SDR can transmit to the base station. In some implementations, the SDR may utilize the digital analog converter based on receiving input from a user of the SDR, at a particular time after receiving the aggregated digital signal, and/or the like.

As shown by reference number 125, the SDR may provide the aggregated analog signal to an RF component associated with the SDR. For example, the SDR may provide the aggregated analog signal to the RF component to facilitate transmission of the aggregated analog signal to the base station, after converting the aggregated digital signal to the aggregated analog signal, based on receiving input to provide the aggregated analog signal to the RF component, and/or the like. In some implementations, the RF component may include an RF antenna, a transceiver, a separate transmitter and receiver, and/or the like.

As shown by reference number 130, the SDR, utilizing the RF component, may select and/or apply an analog gain to the aggregated analog signal. For example, the SDR may select and/or apply an analog gain to the aggregated analog signal after converting the aggregated digital signal into the aggregated analog signal.

In some implementations, the SDR may select the analog gain to apply such that the base station can adjust a set of digital gains selected for the set of user devices. For example, the SDR may select the analog gain such that the base station can adjust the set of digital gains to adjust a respective received power for the set of user devices received by the base station. Continuing with the previous example, the SDR may select the analog gain such that the base station can adjust the set of digital gains by a threshold amount. Continuing still with the previous example, the SDR may select the analog gain, such that adjustments to the set of digital gains does not cause the digital gain to be outside of an available range of digital gains.

As shown by reference number 135, the SDR may transmit the aggregated analog signal to the base station. For example, the SDR may transmit, utilizing the RF component, the aggregated analog signal with the selected analog gain and/or after applying the analog gain to the aggregated analog signal. In some implementations, the SDR may transmit the aggregated analog signal at a particular time, after receiving input from a user of the SDR, according to a schedule, and/or the like.

In some implementations, the aggregated analog signal may emulate a connection attempt of the set of user devices to the base station. For example, the SDR may transmit the aggregated analog signal to emulate the set of user devices attempting to establish a connected state to the base station. In some implementations, the SDR may transmit the aggregated analog signal for at least a threshold amount of time. For example, the SDR may transmit the aggregated analog signal for an amount of time that is sufficient for the base station to utilize a power control algorithm to settle the digital gains of the uplink physical channels to a long-term converged digital gain:

$$g_\infty^{i,j}$$

Turning to FIG. 1B, and as shown by reference number 140, the SDR may determine calibration parameters for a load test and/or perform an action after conclusion of the calibration test. For example, the SDR may determine the calibration parameters and/or may perform the action after transmitting the aggregated analog signal for at least a threshold amount of time, after completing the calibration test, and/or the like. In some implementations, the calibration parameters may include an analog gain to be used for the load test, digital gains to be used for the load test, and/or the like.

As shown by reference number 145, the SDR may determine the calibration parameters and/or may perform the action based on various outcomes of the calibration test. For example, the SDR may determine different calibration parameters and/or may perform different actions for different outcomes of the calibration test, may determine the calibration parameters and/or may perform the actions in different manners for different outcomes of the calibration test, and/or the like.

As shown by reference number 150, the SDR may determine the calibration parameters based on a first outcome of the calibration test (outcome 1). Assume, with regard to the first outcome, that all user devices included in the set of user devices have connected to the base station by the end of the calibration test and that the digital gains for the uplink physical channels have converged to a respective non-saturated value within the dynamic range. In some implementations, the SDR may determine an average long-term gain for a physical uplink channel after the calibration test using the equation:

$$g_\infty^j = E[g_\infty^{i,j}]$$

where $E[g_\infty^{i,j}]$ is the average long-term gain across user devices for a physical channel.

In some implementations, the SDR may determine a converged long-term gain range in dB as the interval $\Delta = 10 \log(g_{\infty,max}/g_{\infty,min})$, where a $g_{\infty,max} = \max_j(g_\infty^j)$ and $g_{\infty,min} = \min_j(g_\infty^j)$. In some implementations, a set of nominal gains $g_0^j$ for physical uplink channels $j=1, \ldots, M$ can be different before the calibration test and after the calibration test. In some implementations, calibrated nominal gains may be established during the calibration test and may remain fixed until a subsequent calibration test is performed. For example, an initial nominal gain may be represented by $g_{0,init}^j$ and may be determined based on an open loop power control estimate provided by a base station configuration. In some implementations, nominal gains may be chosen such that a nominal gain range is centered in a middle of the digital gain range with a size of the nominal gain range set by the open loop power control provided by the base station configuration.

In some implementations, the SDR may determine the converged long-term gain range such that a converged long-term gain range is in a middle of the dynamic range. For example, the SDR may determine the converged long-term gain range such that there is an equal quantity of dBs between a lower limit of the converged long-term gain range and the lower limit of the dynamic range, and between the upper limit of the converged long-term gain range and the upper limit of the dynamic range. Continuing with the previous example, the SDR may determine a gain margin of dBs (C) at both limits of the dynamic range, such that $2C+\Delta=D$.

In some implementations, the SDR may determine a nominal digital gain of a physical channel for the load test (e.g., a digital gain that is to be applied at a start of the load test) that has a largest converged long-term gain based on an equation. For example, the SDR may determine the nominal digital gain based on the equation:

$$C = 10 \log_{10}(g_{high}/g_{0,max})$$

where C is the gain margin of dBs.

In some implementations, and for the physical uplink channel that has the largest converged long-term gain, the SDR may determine a value of an analog gain to be applied to an aggregated analog signal based on the following condition:

$$g_{0,max} = g_\infty^j$$

In some implementations, to determine the value of the analog gain (H), the SDR may determine an adjustment to a default analog gain (e.g., a default uplink RF analog gain) ($H_{def}$) based on the equation:

$$H = H_{def} \frac{g_{0,max}}{g_\infty^j}$$

In some implementations, the SDR may determine a correction value A for H based on the equation:

$$A = 10\log_{10}\left(\frac{g_{0,max}}{g_\infty^j}\right)$$

Figure 7:
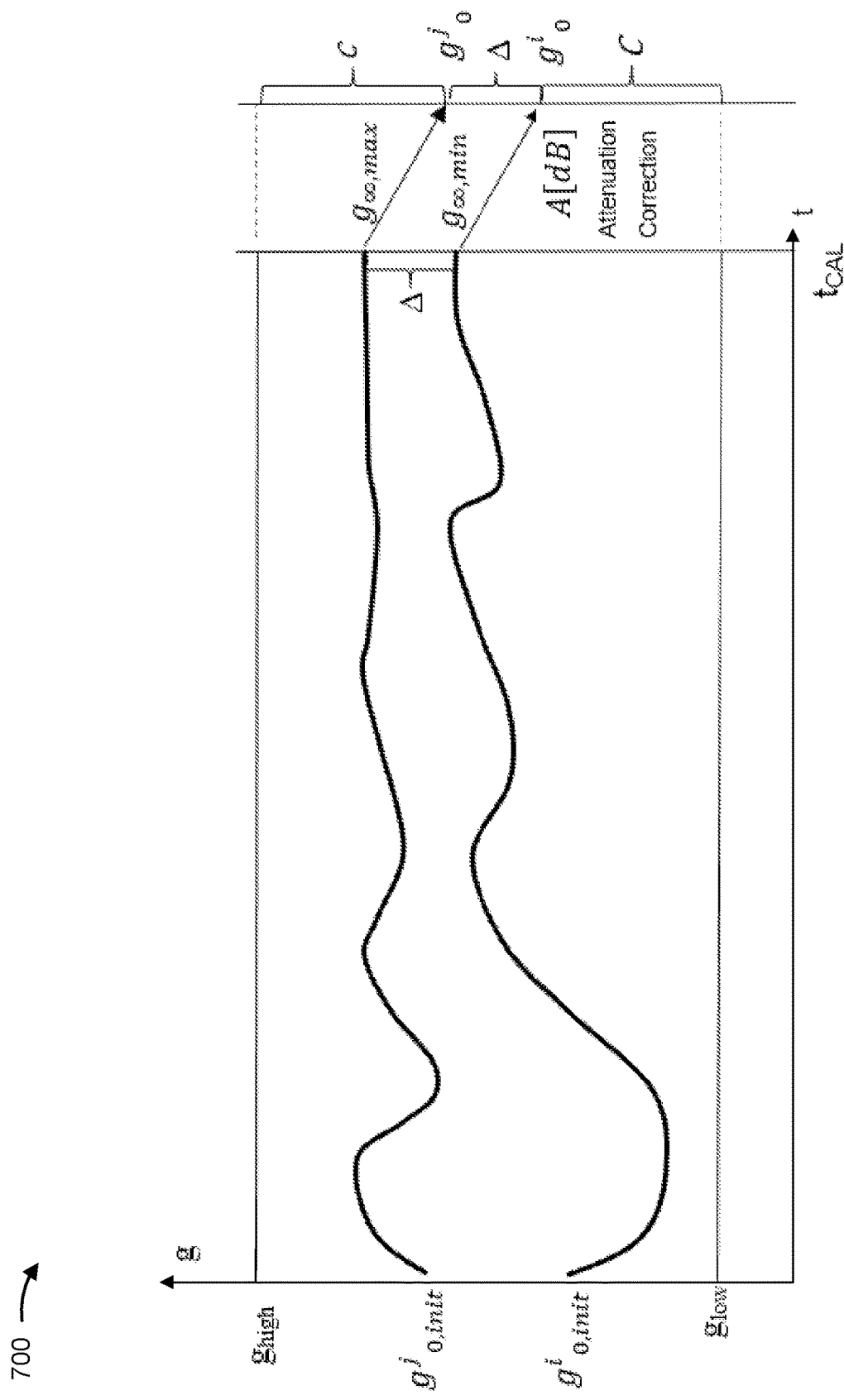
FIG. 7 is a diagram related to a digital gain convergence during a calibration test described herein.
Figure 8:
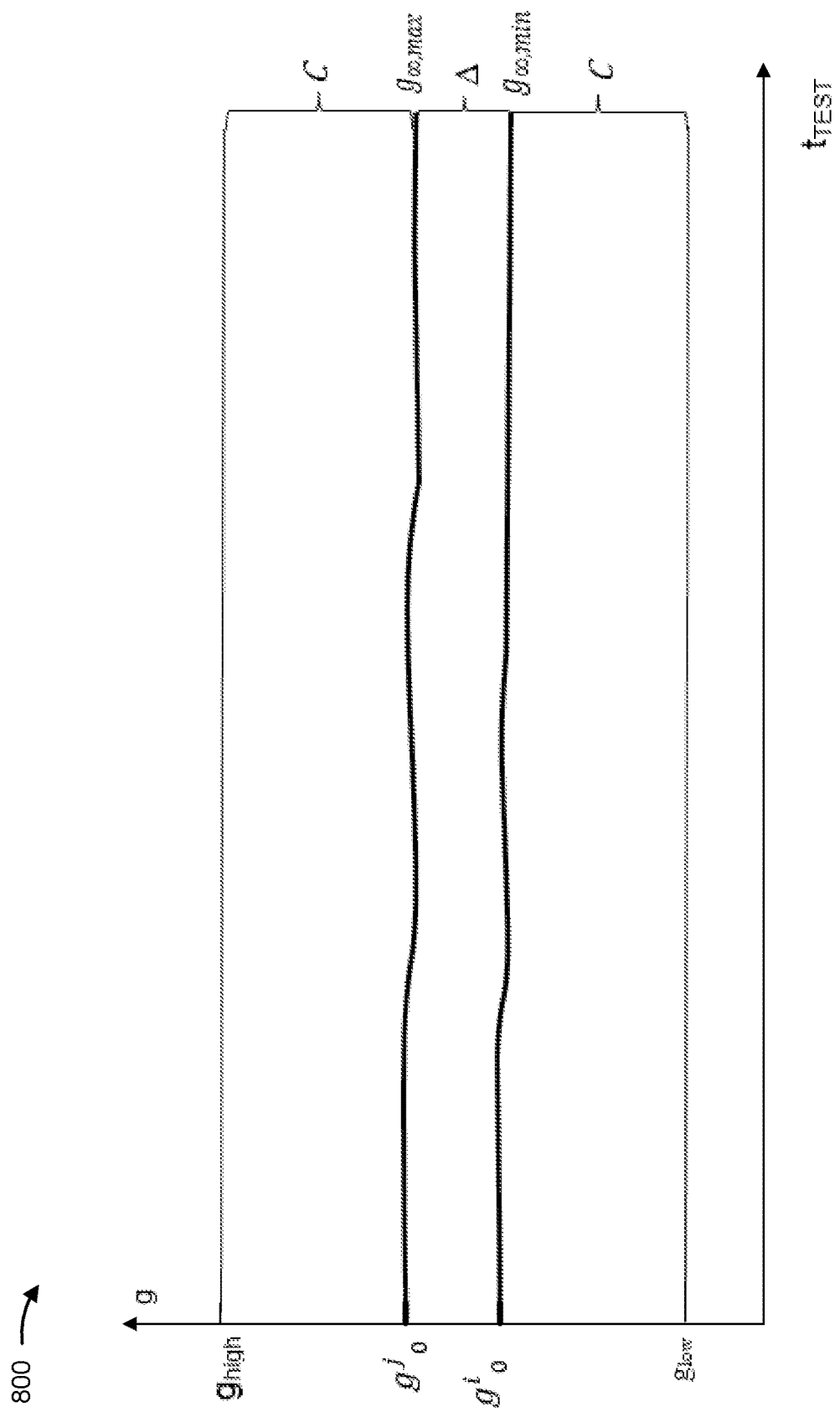
FIG. 8 is a diagram related to an expected digital gain convergence during a nominal load test described herein.

In this way, the SDR may determine calibration parameters based on the first outcome. In some implementations, the SDR may use initial nominal gains set as $$g_0^i = g_\infty^i \left(\frac{g_{0,max}}{g_\infty^j}\right)$$

for tests following the calibration test (e.g., additional calibration tests, a load test, and/or the like). Graphical illustration of gain convergence and/or calibration procedure is shown in FIGS. 7-8, described elsewhere herein.

As shown by reference number 155, the SDR may perform an action based on a second outcome of the calibration test (outcome 2). For example, the SDR may perform the action after performing the calibration test, after determining whether the set of user devices have established a connection to the base station, and/or the like. Assume, with regard to the second outcome, that digital gains for a physical uplink channel have a threshold variance across the user devices after the calibration test has been performed. For example, the SDR may determine that the digital gains have the threshold variance after the set of user devices have established a connection to the base station, after performing the calibration test for at least a threshold amount of time, and/or the like.

In some implementations, the SDR may trigger an alarm based on the digital gains having the threshold variance (e.g., may output a sound, activate a light, provide a notification for display via a display associated with the SDR, and/or the like). For example, the alarm may indicate that the calibration test and/or a power control convergence is not stable for the physical uplink channel after performing the calibration test. Additionally, or alternatively, the SDR may re-perform the calibration test, may request input to re-perform the calibration test, and/or the like to determine the calibration parameters for the load test.

In this way, the SDR may perform an action based on the second outcome.

As shown by reference number 160, the SDR may perform the action based on a third outcome of the calibration test (outcome 3). For example, the SDR may perform the action after performing the calibration test, after determining whether the set of user devices have established a connection to the base station, and/or the like. Assume, for the third outcome, that all of the user devices of the set of user devices have established a connection to the base station, but that digital gains for at least one of the physical uplink channels associated with the calibration test have converged to a value outside of the dynamic range (e.g., which can cause rounding issues when determining values of the calibration parameters). For example, the SDR may determine that all of user devices of the set of user devices have connected to the base station (e.g., during the calibration test, after performing the calibration test for at least a threshold amount of time, and/or the like), and the SDR may determine that the digital gains for a physical uplink channel associated with the calibration test have converged to a value outside of the dynamic range.

In some implementations, the SDR may perform an action based on whether the digital gains converged outside of an upper limit of the dynamic range or outside of a lower limit of the dynamic range. For example, when the digital gains converge outside of the upper limit of the dynamic range, the SDR may increase the analog gain by an amount of dBs (e.g., a default amount, an amount input by a user of the SDR, and/or the like), and may re-perform the calibration test. Additionally, or alternatively, when the digital gains converge outside of the lower limit of the dynamic range, the SDR may decrease the analog gain by an amount of dBs, and may re-perform the calibration test.

In this way, the SDR may perform an action based on the third action.

As shown by reference number 165, the SDR may perform the action based on a fourth outcome of the calibration test (outcome 4). For example, the SDR may perform the action based on the calibration test resulting in the fourth outcome.

Assume, for the fourth outcome, that the digital gains converged outside of both the upper limit of the dynamic range and the lower limit of the dynamic range in association with the calibration test. For example, the SDR may determine that the digital gains converged outside of both the upper limit of the dynamic range and the lower limit of the dynamic range during performance of the calibration test, after the calibration test, and/or the like. In some implementations, the SDR may trigger an alarm, may output a notification, and/or the like to indicate that the fourth outcome has occurred and/or to request manual intervention in the calibration test (e.g., manual intervention to adjust configuration of the base station, such as to decrease (e.g., narrow) the needed dynamic range). Additionally, or alternatively, the SDR may adjust configuration of the base station in this manner. In some implementations, the SDR may re-perform the calibration test after the configuration of the base station has been adjusted.

In this way, the SDR may perform an action based on the fourth action.

As shown by reference number 170, the SDR may perform the action based on a fifth outcome of the calibration test (e.g., outcome 5). For example, the SDR may perform the action based on the calibration test resulting in the fifth outcome. Assume, for the fifth outcome, that at least one user device of the set of user devices has not connected to the base station in association with the calibration test. For example, the SDR may determine that at least one user device of the set of user devices has not connected the base station during performance of the calibration test, after performing the calibration test for a threshold amount of time, and/or the like.

In some implementations, the SDR may trigger an alarm and/or may output a notification to request that the user perform manual downlink and/or uplink configuration of the calibration test (e.g., to compensate for loss of the aggregated analog signal between the SDR and the base station, to calibrate the dynamic range, and/or the like). In some implementations, the SDR may perform the downlink and/or the uplink configuration. In some implementations, the SDR may re-perform the calibration test after the downlink and/or uplink configuration (e.g., may re-perform the calibration test for all user devices of the set of user devices, may re-perform the calibration test for any user devices of the set of user devices that failed to connect to the base station, and/or the like).

In this way, the SDR may perform an action based on the fifth outcome.

As shown by reference number 175, the SDR may perform the load test. For example, the SDR may perform the load test after determining the calibration parameters for the load test. In some implementations, the SDR may perform the load test by generating a set of digital signals to emulate a set of user devices, by aggregating the set of digital signals to form an aggregated digital signal, by converting the aggregated digital signal to the aggregated analog signal, by applying analog gain to the aggregated analog signal, by transmitting the aggregated analog signal to the base station, and/or the like to perform the load test.

In some implementations, the SDR may perform the load test using the calibration parameters. For example, the SDR may perform the load test using analog gain H, such that a nominal gain range $[g_{min}, g_{max}]$ for a digital gain is centered in a middle of an available digital gain range. This provides a maximum digital gain margin within the available digital gain range $[g_{low}, g_{high}]$. This facilitates realistic emulation of traffic on various uplink channels, such as due to mobility, fading, and/or the like (e.g., by facilitating adjustment of digital gains for physical uplink channels during the load test). For example, maximizing the digital gain range may reduce or eliminate a need for rounding and/or saturation when modifying the digital gain during the load test.

Continuing with the previous example, this can accommodate the largest possible channel impairments for different user devices associated with the load test, without causing fixed point errors. This can accommodate situations in long-term evolution (LTE)-based load tests where, following a change in a digital gain of a physical uplink channel, the base station drives a user device's power control so that a power spectral density for a physical uplink channel at the base station receiver returns to the value driven by the nominal digital gain (without exceeding a threshold resulting by fixed-point errors).

In some implementations, the SDR may perform the load test using the correction value A. For example, the SDR may use the correction value A to adjust the analog gain H for the load test. Additionally, or alternatively, the SDR may perform the load test using nominal digital gains that are equal to the average long-term gains of an uplink physical channel across the set of user devices (e.g., equal to $g_\infty^j$ described elsewhere herein). For example, the SDR may set nominal digital gains $g_0^j$ equal to $$g_\infty^j \left( \frac{g_{0,max}}{g_\infty^j} \right).$$

In some implementations, the SDR may perform one or more actions in association with performing the load test. For example, the SDR may output a notification that the load test is being performed and/or that the load test is complete. Additionally, or alternatively, and as another example, the SDR may monitor the load test and may record data related to the load test (e.g., data that identifies a performance of the set of user devices and/or of the base station). Additionally, or alternatively, and as another example, the SDR may generate a report related to the load test and may output the report for display via a display associated with the SDR, via a user device associated with a user of the SDR, and/or the like.

In this way, the SDR may perform a calibration test to determine calibration parameters for a load test. For example, the SDR may perform the calibration test without information related to attenuation between the SDR and the base station, without depending on an employed wireless protocol, regardless of a quantity and/or names of physical uplink channels associated with the calibration test, without regard to a particular algorithm used by the base station for controlling power of a user device emulated by the SDR, and/or the like. This reduces or eliminates inaccurate selection of calibration parameters for the load test, thereby conserving time and/or processing resources that would otherwise be consumed performing the load test multiple times. In addition, this reduces or eliminates human subjectivity and/or action in preparation of the calibration parameters for the load test. Further, this provides a way to automatically determine calibration parameters for a load test, thereby increasing an efficiency of determining calibration parameters.

As indicated above, FIGS. 1A-1B are provided merely as an example. Other examples are possible and may differ from what was described with regard to FIGS. 1A-1B. The implementations described with regard to FIGS. 1A-1B apply to various wireless schemes. For example, to apply the implementations to a long-term evolution (LTE) scheme, the calibration test may use PUSCH and PUCCH, which may be independently power controlled by independent power control commands (e.g., an uplink SRS may not be used in this case for the calibration test as the uplink SRS may be controlled with the same power control commands as PUCCH).

Figure 2:
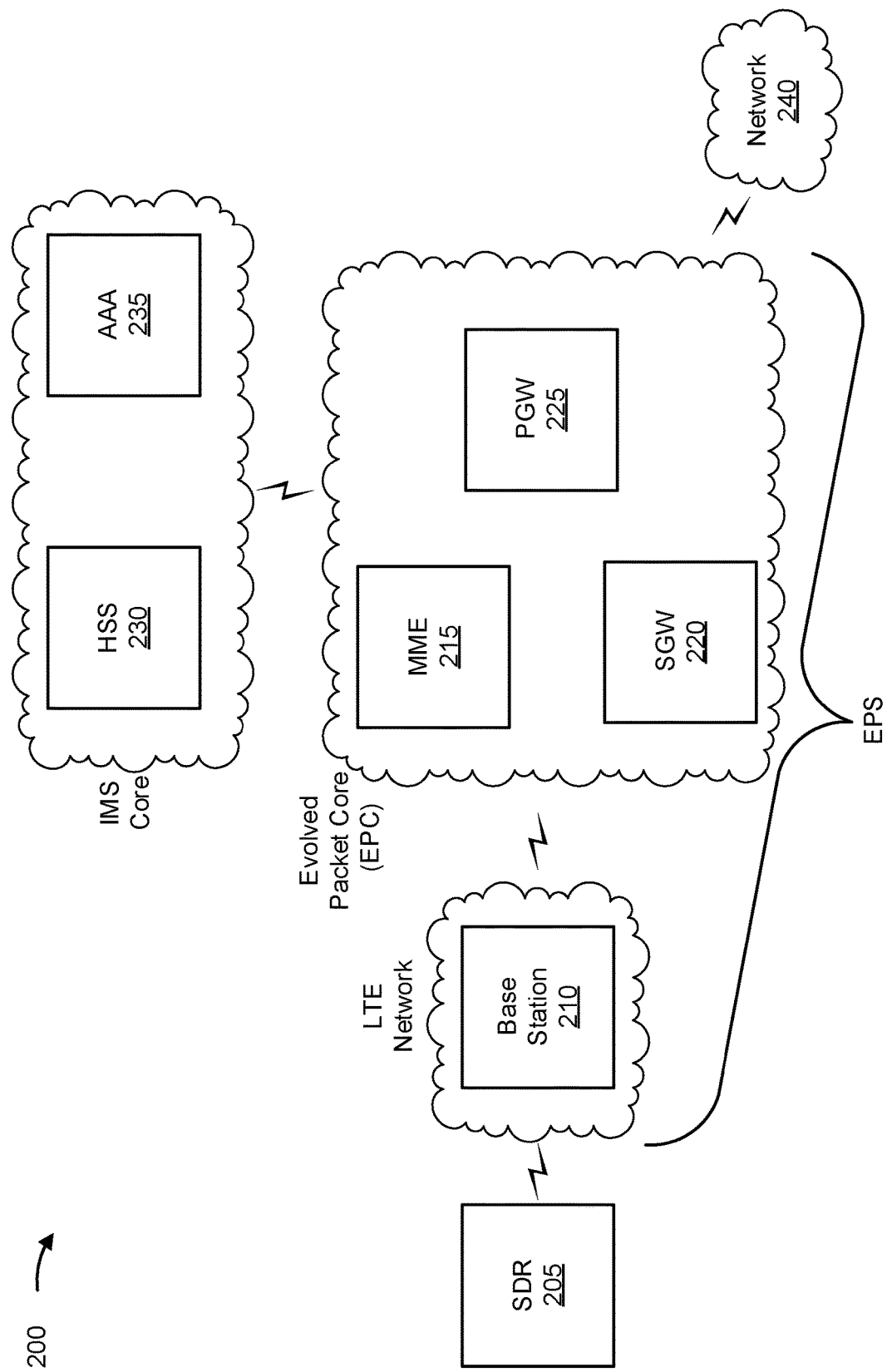
FIG. 2 is a diagram of an example environment in which systems and/or methods, described herein, may be implemented.

FIG. 2 is a diagram of an example environment 200 in which systems and/or methods, described herein, may be implemented. As shown in FIG. 2, environment 200 may include a SDR 205, a base station 210, a mobility management entity device (MME) 215, a serving gateway (SGW) 220, a packet data network gateway (PGW) 225, a home subscriber server (HSS) 230, an authentication, authorization, and accounting server (AAA) 235, and a network 240. Devices of environment 200 may interconnect via wired connections, wireless connections, or a combination of wired and wireless connections.

Some implementations are described herein as being performed within a long term evolution (LTE) network for explanatory purposes. Some implementations can be performed within a network that is not an LTE network, such as a third generation (3G) network, a fourth generation (4G) network, a fifth generation (5G) network, etc.

Environment 200 includes an evolved packet system (EPS) that includes an LTE network and/or an evolved packet core (EPC) that operate based on a third generation partnership project (3GPP) wireless communication standard. The LTE network may include a radio access network (RAN) that includes one or more base stations 210 that take the form of evolved Node Bs (eNBs), next generation Node Bs (gNBs), and/or the like via which SDR 205 communicates with the EPC. The EPC includes MME 215, SGW 220, and/or PGW 225 that enable SDR 205 to communicate with network 240 and/or an Internet protocol (IP) multimedia subsystem (IMS) core. The IMS core may include HSS 230 and/or AAA 235, and can manage device registration and authentication, session initiation, etc., associated with SDR 205. HSS 230 and/or AAA 235 can reside in the EPC and/or the IMS core.

SDR 205 includes one or more devices capable of communicating with base station 210 and/or a network (e.g., network 240), such as to perform a calibration test, a load test, and/or the like. For example, SDR 205 may include a SDR, a wireless simulator, a channel simulator, a server device (e.g., in a data center), or a similar type of device. In some implementations, SDR 205 may generate a digital signal and/or an analog signal to emulate a set of user devices for a calibration test, a load test, and/or the like, as described elsewhere herein. Additionally, or alternatively, SDR 205 may determine calibration parameters for a load test based on a result of performing a calibration test, as described elsewhere herein. In some implementations, a user device that SDR 205 emulates may include a mobile phone (e.g., a smartphone or a radiotelephone), a laptop computer, a tablet computer, a gaming device, a wearable communication device (e.g., a smart wristwatch or a pair of smart eyeglasses), or a similar type of device.

Base station 210 includes one or more devices capable of transferring traffic, such as audio, video, text, and/or other traffic, destined for and/or received from SDR 205. In some implementations, base station 210 may include an eNB, a gNB, and/or the like associated with the LTE network that receives traffic from and/or sends traffic to network 240 via SGW 220 and/or PGW 225. Additionally, or alternatively, one or more base stations 210 can be associated with a RAN that is not associated with the LTE network. Base station 210 can send traffic to and/or receive traffic from SDR 205 via an air interface. In some implementations, base station 210 may include a small cell base station, such as a base station of a microcell, a picocell, and/or a femtocell.

MME 215 includes one or more devices, such as one or more server devices, capable of managing authentication, activation, deactivation, and/or mobility functions associated with SDR 205. In some implementations, MME 215 can perform operations relating to authentication of SDR 205. Additionally, or alternatively, MME 215 can facilitate the selection of a particular SGW 220 and/or a particular PGW 225 to serve traffic to and/or from SDR 205. MME 215 can perform operations associated with handing off SDR 205 from a first base station 210 to a second base station 210 when SDR 205 is transitioning from a first cell associated with the first base station 210 to a second cell associated with the second base station 210. Additionally, or alternatively, MME 215 can select another MME (not pictured), to which SDR 205 should be handed off (e.g., when SDR 205 moves out of range of MME 215).

SGW 220 includes one or more devices capable of routing packets. For example, SGW 220 may include one or more data processing and/or traffic transfer devices, such as a gateway, a router, a modem, a switch, a firewall, a network interface card (NIC), a hub, a bridge, a server device, an optical add/drop multiplexer (OADM), or any other type of device that processes and/or transfers traffic. In some implementations, SGW 220 can aggregate traffic received from one or more base stations 210 associated with the LTE network, and can send the aggregated traffic to network 240 (e.g., via PGW 225) and/or other network devices associated with the EPC and/or the IMS core. SGW 220 can also receive traffic from network 240 and/or other network devices, and can send the received traffic to SDR 205 via base station 210. Additionally, or alternatively, SGW 220 can perform operations associated with handing off SDR 205 to and/or from an LTE network.

PGW 225 may include one or more devices capable of providing connectivity for SDR 205 to external packet data networks (e.g., other than the depicted EPC and/or LTE network). For example, PGW 225 may include one or more data processing and/or traffic transfer devices, such as a gateway, a router, a modem, a switch, a firewall, a NIC, a hub, a bridge, a server device, an OADM, or any other type of device that processes and/or transfers traffic. In some implementations, PGW 225 can aggregate traffic received from one or more SGWs 220, and can send the aggregated traffic to network 240. Additionally, or alternatively, PGW 225 can receive traffic from network 240, and can send the traffic to SDR 205 via SGW 220 and base station 210. PGW 225 can record data usage information (e.g., byte usage), and can provide the data usage information to AAA 235.

HSS 230 includes one or more devices, such as one or more server devices, capable of managing (e.g., receiving, generating, storing, processing, and/or providing) information associated with SDR 205. For example, HSS 230 can manage subscription information associated with SDR 205, such as information that identifies a subscriber profile of a user associated with SDR 205, information that identifies services and/or applications that are accessible to SDR 205, location information associated with SDR 205, a network identifier (e.g., a network address) that identifies SDR 205, information that identifies a treatment of SDR 205 (e.g., quality of service information, a quantity of minutes allowed per time period, a quantity of data consumption allowed per time period, etc.), and/or similar information. HSS 230 can provide this information to one or more other devices of environment 200 to support the operations performed by those devices.

AAA 235 includes one or more devices, such as one or more server devices, that perform authentication, authorization, and/or accounting operations for communication sessions associated with SDR 205. For example, AAA 235 can perform authentication operations for SDR 205 and/or a user of SDR 205 (e.g., using one or more credentials), can control access, by SDR 205, to a service and/or an application (e.g., based on one or more restrictions, such as time-of-day restrictions, location restrictions, single or multiple access restrictions, read/write restrictions, etc.), can track resources consumed by SDR 205 (e.g., a quantity of voice minutes consumed, a quantity of data consumed, etc.), and/or can perform similar operations.

Network 240 includes one or more wired and/or wireless networks. For example, network 240 may include a cellular network (e.g., a long-term evolution (LTE) network, a code division multiple access (CDMA) network, a 3G network, a 4G network, a 5G network, or another type of cellular network), a public land mobile network (PLMN), a local area network (LAN), a wide area network (WAN), a metropolitan area network (MAN), a telephone network (e.g., the Public Switched Telephone Network (PSTN)), a private network, an ad hoc network, an intranet, the Internet, a fiber optic-based network, a cloud computing network, and/or the like, and/or a combination of these or other types of networks.

The number and arrangement of devices and networks shown in FIG. 2 are provided as an example. In practice, there may be additional devices and/or networks, fewer devices and/or networks, different devices and/or networks, or differently arranged devices and/or networks than those shown in FIG. 2. Furthermore, two or more devices shown in FIG. 2 may be implemented within a single device, or a single device shown in FIG. 2 may be implemented as multiple, distributed devices. Additionally, or alternatively, a set of devices (e.g., one or more devices) of environment 200 may perform one or more functions described as being performed by another set of devices of environment 200.

Figure 3:
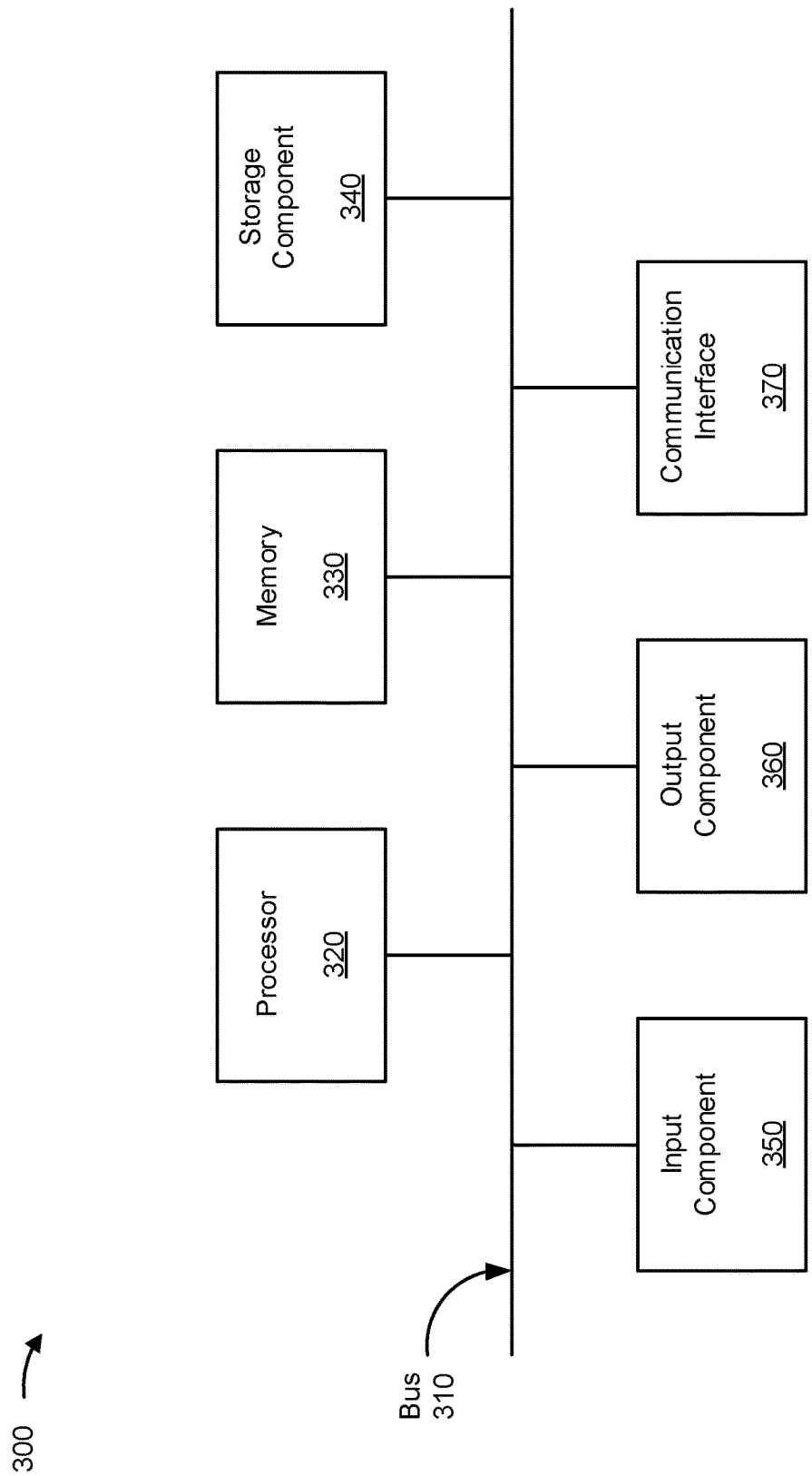
FIG. 3 is a diagram of example components of one or more devices of FIG. 2.

FIG. 3 is a diagram of example components of a device 300. Device 300 may correspond to SDR 205, base station 210, MME 215, SGW 220, PGW 225, HSS 230, and/or AAA 235. In some implementations, SDR 205, base station 210, MME 215, SGW 220, PGW 225, HSS 230, and/or AAA 235 may include one or more devices 300 and/or one or more components of device 300. As shown in FIG. 3, device 300 may include a bus 310, a processor 320, a memory 330, a storage component 340, an input component 350, an output component 360, and a communication interface 370.

Bus 310 includes a component that permits communication among the components of device 300. Processor 320 is implemented in hardware, firmware, or a combination of hardware and software. Processor 320 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 320 includes one or more processors capable of being programmed to perform a function. Memory 330 includes a random access memory (RAM), a read only memory (ROM), and/or another type of dynamic or static storage device (e.g., a flash memory, a magnetic memory, and/or an optical memory) that stores information and/or instructions for use by processor 320.

Storage component 340 stores information and/or software related to the operation and use of device 300. For example, storage component 340 may include a hard disk (e.g., a magnetic disk, an optical disk, a magneto-optic disk, and/or a solid state disk), a compact disc (CD), a digital versatile disc (DVD), a floppy disk, a cartridge, a magnetic tape, and/or another type of non-transitory computer-readable medium, along with a corresponding drive.

Input component 350 includes a component that permits device 300 to receive information, such as via user input (e.g., a touch screen display, a keyboard, a keypad, a mouse, a button, a switch, and/or a microphone). Additionally, or alternatively, input component 350 may include a sensor for sensing information (e.g., a global positioning system (GPS) component, an accelerometer, a gyroscope, and/or an actuator). Output component 360 includes a component that provides output information from device 300 (e.g., a display, a speaker, and/or one or more light-emitting diodes (LEDs)).

Communication interface 370 includes a transceiver-like component (e.g., a transceiver and/or a separate receiver and transmitter) that enables device 300 to communicate with other devices, such as via a wired connection, a wireless connection, or a combination of wired and wireless connections. Communication interface 370 may permit device 300 to receive information from another device and/or provide information to another device. For example, communication interface 370 may include an Ethernet interface, an optical interface, a coaxial interface, an infrared interface, a radio frequency (RF) interface, a universal serial bus (USB) interface, a Wi-Fi interface, a cellular network interface, or the like.

Device 300 may perform one or more processes described herein. Device 300 may perform these processes based on to processor 320 executing software instructions stored by a non-transitory computer-readable medium, such as memory 330 and/or storage component 340. A computer-readable medium is defined herein as a non-transitory memory device. A memory device includes memory space within a single physical storage device or memory space spread across multiple physical storage devices.

Software instructions may be read into memory 330 and/or storage component 340 from another computer-readable medium or from another device via communication interface 370. When executed, software instructions stored in memory 330 and/or storage component 340 may cause processor 320 to perform one or more processes described herein. Additionally, or alternatively, hardwired circuitry may be used in place of or in combination with software instructions to perform one or more processes described herein. Thus, implementations described herein are not limited to any specific combination of hardware circuitry and software.

The number and arrangement of components shown in FIG. 3 are provided as an example. In practice, device 300 may include additional components, fewer components, different components, or differently arranged components than those shown in FIG. 3. Additionally, or alternatively, a set of components (e.g., one or more components) of device 300 may perform one or more functions described as being performed by another set of components of device 300.

Figure 4:
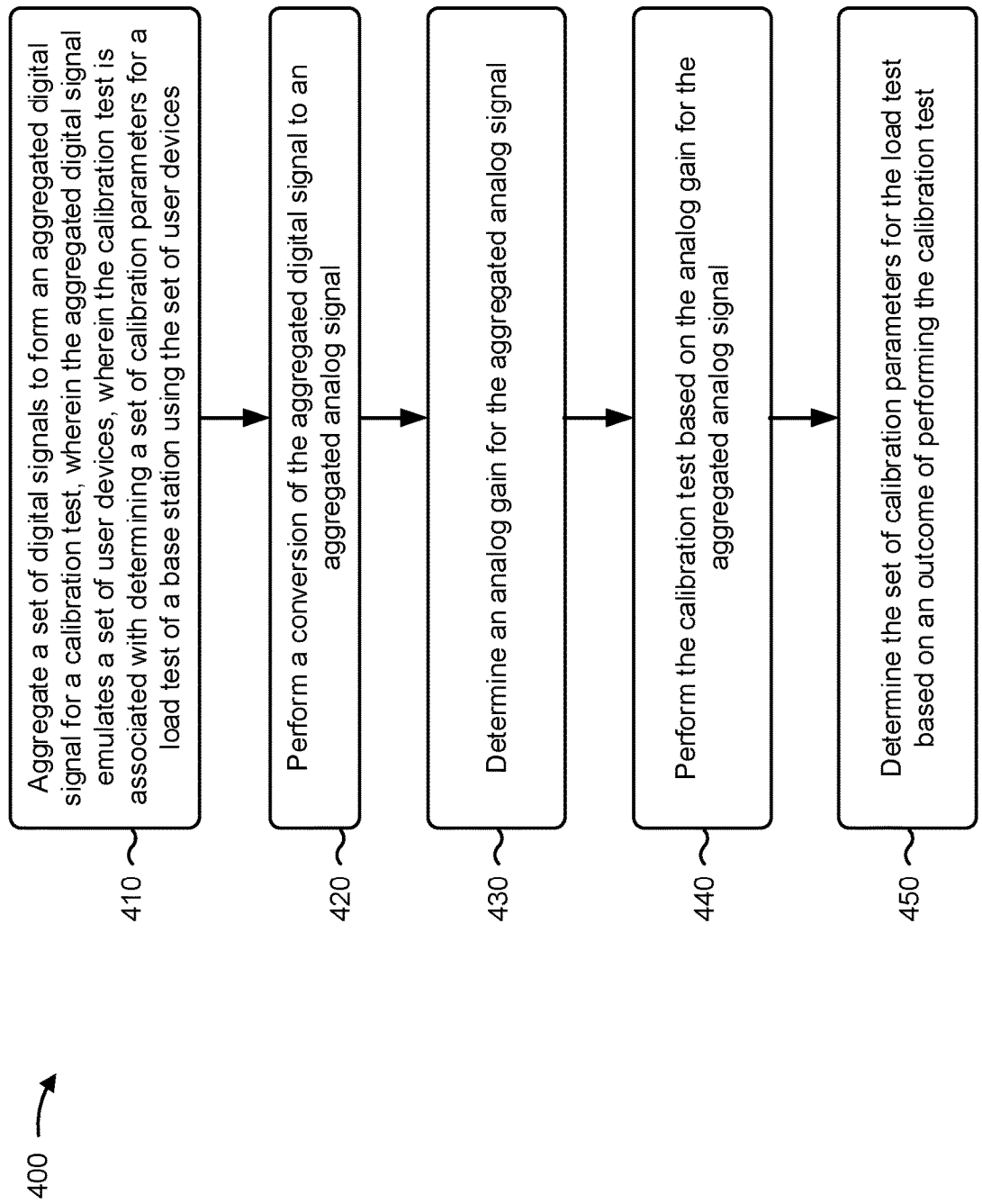
FIG. 4 is a flow chart of an example process for configuring an analog gain for a load test.

FIG. 4 is a flow chart of an example process 400 for configuring an analog gain for a load test. In some implementations, one or more process blocks of FIG. 4 may be performed by a SDR (e.g., SDR 205). In some implementations, one or more process blocks of FIG. 4 may be performed by another device or a group of devices separate from or including the SDR, such as a base station (e.g., base station 210), an MME (e.g., MME 215), a SGW (e.g., SGW 220), a PGW (e.g., PGW 225), a HSS (e.g., HSS 230), and a AAA (e.g., AAA 235).

As shown in FIG. 4, process 400 may include aggregating a set of digital signals to form an aggregated digital signal for a calibration test, wherein the aggregated digital signal emulates a set of user devices, wherein the calibration test is associated with determining a set of calibration parameters for a load test of a base station using the set of user devices (block 410). For example, the SDR (e.g., SDR 205 using processor 320, and/or the like) may aggregate a set of digital signals to form an aggregated digital signal for a calibration test, in a manner that is the same as or similar to that described elsewhere herein. In some implementations, the aggregated digital signal emulates a set of user devices. In some implementations, the calibration test is associated with determining a set of calibration parameters for a load test of a base station using the set of user devices.

As further shown in FIG. 4, process 400 may include performing a conversion of the aggregated digital signal to an aggregated analog signal (block 420). For example, the SDR (e.g., SDR 205 using processor 320) may perform a conversion of the aggregated digital signal to an aggregated analog signal, in a manner that is the same as or similar to that described elsewhere herein.

As further shown in FIG. 4, process 400 may include determining an analog gain for the aggregated analog signal (block 430). For example, the SDR (e.g., SDR 205 using processor 320) may determine an analog gain for the aggregated analog signal, in a manner that is the same as or similar to that described elsewhere herein.

As further shown in FIG. 4, process 400 may include performing the calibration test based on the analog gain for the aggregated analog signal (block 440). For example, the SDR (e.g., SDR 205 using processor 320, input component 350, output component 360, communication interface 370, and/or the like) may perform the calibration test based on the analog gain for the aggregated analog signal, in a manner that is the same as or similar to that described elsewhere herein.

As further shown in FIG. 4, process 400 may include determining the set of calibration parameters for the load test based on an outcome of performing the calibration test (block 450). For example, the SDR (e.g., SDR 205 using processor 320) may determine the set of calibration parameters for the load test based on an outcome of performing the calibration test, in a manner that is the same as or similar to that described elsewhere herein.

Process 400 may include additional implementations, such as any single implementation or any combination of implementations described below and/or in connection with one or more other processes described elsewhere herein.

In some implementations, the SDR may perform the load test based on the set of calibration parameters. In some implementations, the SDR may select a respective digital gain for the set of digital signals prior to aggregating the set of digital signals, wherein the respective digital gain is within a digital gain range that is based on an uplink data path associated with the calibration test.

In some implementations, the respective digital gain is associated with a physical uplink channel and a user device of the set of user devices. In some implementations, the set of calibration parameters includes at least one of: another analog gain for the load test, or another set of nominal digital gains to be used for the load test. In some implementations, a value of the other analog gain causes the respective digital gain to be approximately centered within a digital gain range, and wherein a value of the respective digital gain for the other set of nominal digital gains is approximately equal to an average long-term gain of a physical uplink channel associated with the load test. In some implementations, the SDR may determine that the outcome of the calibration test includes a successful connection of the set of user devices to the base station during the calibration test, and may perform the load test after determining that the outcome of the calibration test includes the successful connection.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

Figure 5:
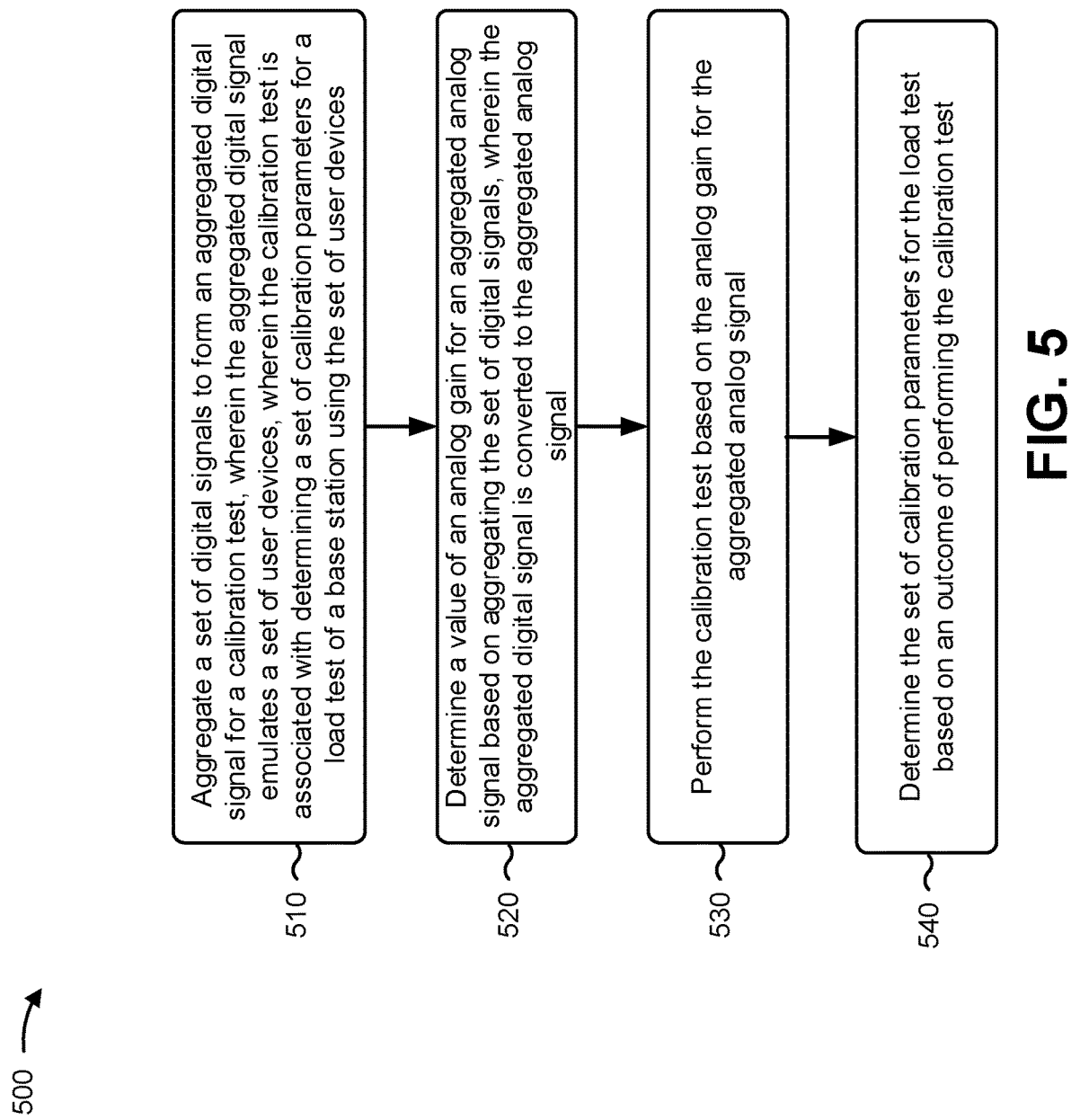
FIG. 5 is a flow chart of an example process for configuring an analog gain for a load test.

FIG. 5 is a flow chart of an example process 500 for configuring an analog gain for a load test. In some implementations, one or more process blocks of FIG. 5 may be performed by a SDR (e.g., SDR 205). In some implementations, one or more process blocks of FIG. 5 may be performed by another device or a group of devices separate from or including the SDR, such as a base station (e.g., base station 210), a MME (e.g., MME 215), a SGW (e.g., SGW 220), a PGW (e.g., PGW 225), a HSS (e.g., HSS 230), and a AAA (e.g., AAA 235).

As shown in FIG. 5, process 500 may include aggregating a set of digital signals to form an aggregated digital signal for a calibration test, wherein the aggregated digital signal emulates a set of user devices, wherein the calibration test is associated with determining a set of calibration parameters for a load test of a base station using the set of user devices (block 510). For example, the SDR (e.g., SDR 205 using processor 320, and/or the like) may aggregate a set of digital signals to form an aggregated digital signal for a calibration test, in a manner that is the same as or similar to that described elsewhere herein. In some implementations, the aggregated digital signal emulates a set of user devices. In some implementations, the calibration test is associated with determining a set of calibration parameters for a load test of a base station using the set of user devices.

As further shown in FIG. 5, process 500 may include determining a value of an analog gain for an aggregated analog signal based on aggregating the set of digital signals, wherein the aggregated digital signal is converted to the aggregated analog signal (block 520). For example, the SDR (e.g., SDR 205 using processor 320) may determine a value of an analog gain for an aggregated analog signal based on aggregating the set of digital signals, in a manner that is the same as or similar to that described elsewhere herein. In some implementations, the aggregated digital signal is converted to the aggregated analog signal.

As further shown in FIG. 5, process 500 may include performing the calibration test based on the analog gain for the aggregated analog signal (block 530). For example, the SDR (e.g., SDR 205 using processor 320, input component 350, output component 360, communication interface 370, and/or the like) may perform the calibration test based on the analog gain for the aggregated analog signal, in a manner that is the same as or similar to that described elsewhere herein.

As further shown in FIG. 5, process 500 may include determining the set of calibration parameters for the load test based on an outcome of performing the calibration test (block 540). For example, the SDR (e.g., SDR 205 using processor 320, and/or the like) may determine the set of calibration parameters for the load test based on an outcome of performing the calibration test, in a manner that is the same as or similar to that described elsewhere herein.

Process 500 may include additional implementations, such as any single implementation or any combination of implementations described below and/or in connection with one or more other processes described elsewhere herein.

In some implementations, the SDR may perform the load test after determining the set of calibration parameters for the load test, or re-perform the calibration test using the set of calibration parameters. In some implementations, the SDR may select a respective digital gain for the set of digital signals prior to aggregating the set of digital signals, wherein a value of the respective digital gain is within a digital gain range that is based on an uplink data path associated with the calibration test.

In some implementations, the SDR may perform a set of actions based on the outcome of performing the calibration test, wherein the set of actions includes at least one of: performing the load test, outputting a first notification indicating that a power control convergence of the calibration test is not stable, outputting a second notification indicating that a digital gain for a physical uplink channel associated with the calibration test has converged outside of a digital gain range during the calibration test, outputting a third notification indicating that the digital gain range for the calibration test is to be modified, or outputting a fourth notification indicating that the set of user devices is to be manually calibrated. In some implementations, the SDR may perform a conversion of the aggregated digital signal to the aggregated analog signal after aggregating the set of digital signals.

In some implementations, the SDR may determine the analog gain such that the base station can adjust a set of digital gains to adjust a respective received power for the set of user devices. In some implementations, the SDR may determine another analog gain for the load test based on the outcome of the calibration test.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

Figure 6:
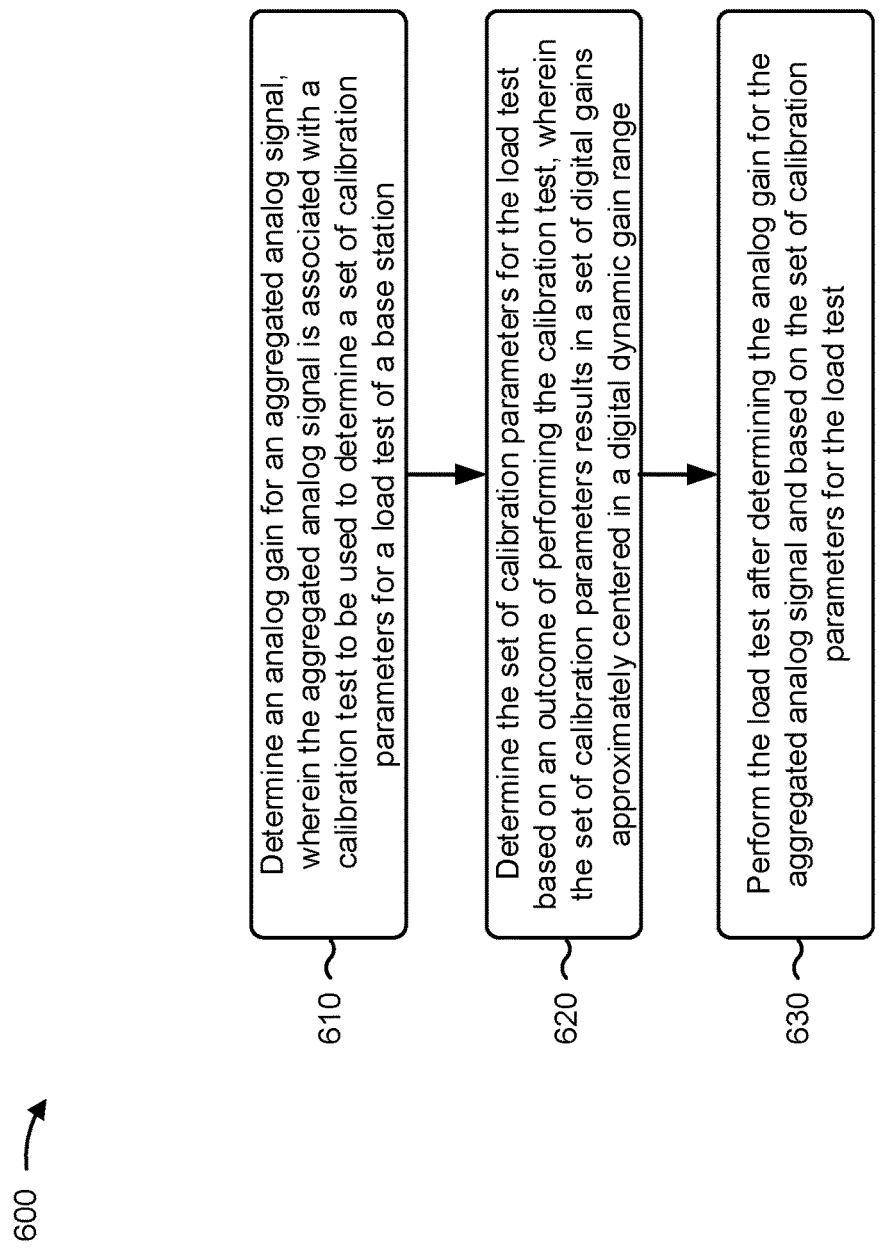
FIG. 6 is a flow chart of an example process for configuring an analog gain for a load test.

FIG. 6 is a flow chart of an example process 600 for configuring an analog gain for a load test. In some implementations, one or more process blocks of FIG. 6 may be performed by a SDR (e.g., SDR 205). In some implementations, one or more process blocks of FIG. 6 may be performed by another device or a group of devices separate from or including the SDR, such as a base station (e.g., base station 210), a MME (e.g., MME 215), a SGW (e.g., SGW 220), a PGW (e.g., PGW 225), a HSS (e.g., HSS 230), and a AAA (e.g., AAA 235).

As shown in FIG. 6, process 600 may include determining an analog gain for an aggregated analog signal, wherein the aggregated analog signal is associated with a calibration test to be used to determine a set of calibration parameters for a load test of a base station (block 610). For example, the SDR (e.g., SDR 205 using processor 320, and/or the like) may determine an analog gain for an aggregated analog signal, in a manner that is the same as or similar to that described elsewhere herein. In some implementations, the aggregated analog signal is associated with a calibration test to be used to determine a set of calibration parameters for a load test of a base station.

As further shown in FIG. 6, process 600 may include determining the set of calibration parameters for the load test based on an outcome of performing the calibration test, wherein the set of calibration parameters results in a set of digital gains approximately centered in a digital dynamic gain range (block 620). For example, the SDR (e.g., SDR 205 using processor 320, and/or the like) may determine the set of calibration parameters for the load test based on an outcome of performing the calibration test, in a manner that is the same as or similar to that described elsewhere herein. In some implementations, the set of calibration parameters results in a set of digital gains approximately centered in a digital dynamic gain range.

As further shown in FIG. 6, process 600 may include performing the load test after determining the analog gain for the aggregated analog signal and based on the set of calibration parameters for the load test (block 630). For example, the SDR (e.g., SDR 205 using processor 320, input component 350, output component 360, communication interface 370, and/or the like) may perform the load test based on the set of calibration parameters for the load test, in a manner that is the same as or similar to that described elsewhere herein.

Process 600 may include additional implementations, such as any single implementation or any combination of implementations described below and/or in connection with one or more other processes described elsewhere herein.

In some implementations, the SDR may select a respective digital gain for a set of digital signals prior to determining the analog gain, may aggregate the set of digital signals to form an aggregated digital signal based on the respective digital gain, and may perform a conversion of the aggregated digital signal to the aggregated analog signal. In some implementations, the SDR may perform the calibration test for a threshold amount of time such that the base station can determine the set of digital gains for a set of physical channels associated with the calibration test.

In some implementations, the SDR may determine a value for another analog gain for the load test such that the digital dynamic gain range for the set of digital gains for the load test is approximately centered within an available digital gain range, and may determine a value of the set of digital gains based on an average long-term gain of a physical channel associated with the load test. In some implementations, the SDR may determine that the outcome of performing the calibration test indicates that a set of user devices associated with the calibration test successfully connected to the base station, and may perform the load test after determining that the outcome of performing the calibration test indicates that the set of user devices successfully connected to the base station. In some implementations, the SDR may transmit the aggregated analog signal to the base station to emulate a set of user devices attempting to connect to the base station.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

FIG. 7 is a diagram related to a digital gain convergence during a calibration test described herein.

FIG. 7 shows digital gain convergence during a calibration test of a length of time $t_{CAL}$. FIG. 7 shows two uplink channels j and i for explanatory and/or illustrative purposes. In some implementations, the SDR may determine attenuation correction A[dB] such that long-term converged digital gains $g_{\infty,max}$ and $g_{\infty,min}$ are centered in the digital gain range and approximately equal to the initial nominal gains $g_0^j$ and $g_0^i$, respectively.

As indicated above, FIG. 7 is provided merely as an example. Other examples are possible and may differ from what was described with regard to FIG. 7.

FIG. 8 is a diagram related to an expected digital gain convergence during a nominal load test described herein.

FIG. 8 shows an example of expected digital gain convergence during a nominal load test of duration $t_{TEST}$.

As indicated above, FIG. 8 is provided merely as an example. Other examples are possible and may differ from what was described with regard to FIG. 8.

The foregoing disclosure provides illustration and description, but is not intended to be exhaustive or to limit the implementations to the precise form disclosed. Modifications and variations are possible in light of the above disclosure or may be acquired from practice of the implementations.

As used herein, the term component is intended to be broadly construed as hardware, firmware, and/or a combination of hardware and software.

Some implementations are described herein in connection with thresholds. As used herein, satisfying a threshold may refer to a value being greater than the threshold, more than the threshold, higher than the threshold, greater than or equal to the threshold, less than the threshold, fewer than the threshold, lower than the threshold, less than or equal to the threshold, equal to the threshold, or the like.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware can be designed to implement the systems and/or methods based on the description herein.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A method, comprising:
    generating, by a device, a set of digital signals for a set of user devices for a set of uplink channels to emulate the set of user devices;
    aggregating, by the device, the set of digital signals to form an aggregated digital signal for a calibration test,
        wherein the calibration test is associated with determining a set of calibration parameters for a load test of a base station using the set of user devices;
    performing, by the device, a conversion of the aggregated digital signal to an aggregated analog signal;
    determining, by the device and based on the conversion of the aggregated digital signal to the aggregated analog signal, an analog gain for the aggregated analog signal such that the base station adjusts a respective received power, for the set of user devices, received by the base station;
    performing, by the device, the calibration test based on the analog gain for the aggregated analog signal; and
    determining, by the device, the set of calibration parameters for the load test based on an outcome of performing the calibration test.

2. The method of claim 1, wherein emulating the set of user devices comprises:
    staggering emulated actions of the set of user devices to establish a particular traffic flow.

3. The method of claim 1, wherein the determining the analog gain comprises:
    determining the analog gain such that adjustments to the set of digital gains does not cause a digital gain to be outside of an available range of digital gains.

4. The method of claim 1, wherein the set of calibration parameters includes at least one of:
    another analog gain for the load test, or
    another set of digital gains to be used for the load test.

5. The method of claim 1, wherein determining the set of calibration parameters comprises:
    determining a nominal digital gain of a physical channel for the load test.

6. The method of claim 1, wherein the set of calibration parameters include an average long-term gain for a physical uplink channel.

7. The method of claim 1, wherein determining the set of calibration parameters comprises:
    determining a converged long-term gain range such that the converged long-term gain is in a middle of a dynamic range.

8. A device, comprising:
    one or more memories; and
    one or more processors, communicatively coupled to the one or more memories, configured to:
        generate a set of digital signals for a set of user devices for a set of uplink channels to emulate the set of user devices;
        aggregate the set of digital signals to form an aggregated digital signal for a calibration test,
            wherein the calibration test is associated with determining a set of calibration parameters for a load test of a base station using the set of user devices;
        perform a conversion of the aggregated digital signal to an aggregated analog signal;
        determine, based on the conversion of the aggregated digital signal to the aggregated analog signal, an analog gain for the aggregated analog signal such that the base station adjusts a respective received power, for the set of user devices, received by the base station;
        perform the calibration test based on the analog gain for the aggregated analog signal; and
        determine the set of calibration parameters for the load test based on an outcome of performing the calibration test.

9. The device of claim 8, wherein the one or more processors, when emulating the set of user devices, are configured to:
    stagger emulated actions of the set of user devices to establish a particular traffic flow.

10. The device of claim 8, wherein the one or more processors, when determining the analog gain, are configured to:
    determine the analog gain such that adjustments to the set of digital gains does not cause a digital gain to be outside of an available range of digital gains.

11. The device of claim 8, wherein the set of calibration parameters includes at least one of:
    another analog gain for the load test, or
    another set of digital gains to be used for the load test.

12. The device of claim 8, wherein the one or more processors, when determining the set of calibration parameters, are configured to:

determine a nominal digital gain of a physical channel for the load test.

13. The device of claim 8, wherein the set of calibration parameters include an average long-term gain for a physical uplink channel.

14. The device of claim 8, wherein the one or more processors, when determining the set of calibration parameters, are configured to:
   determine a converged long-term gain range such that the converged long-term gain is in a middle of a dynamic range.

15. A non-transitory computer-readable medium storing a set of instructions, the set of instructions comprising:
   one or more instructions that, when executed by one or more processors of a device, cause the device to:
      generate a set of digital signals for a set of user devices for a set of uplink channels to emulate the set of user devices;
      aggregate the set of digital signals to form an aggregated digital signal for a calibration test,
         wherein the calibration test is associated with determining a set of calibration parameters for a load test of a base station using the set of user devices;
      perform a conversion of the aggregated digital signal to an aggregated analog signal;
      determine, based on the conversion of the aggregated digital signal to the aggregated analog signal, an analog gain for the aggregated analog signal such that the base station adjusts a respective received power, for the set of user devices, received by the base station;
      perform the calibration test based on the analog gain for the aggregated analog signal; and
      determine the set of calibration parameters for the load test based on an outcome of performing the calibration test.

16. The non-transitory computer-readable medium of claim 15, wherein the one or more instructions, that cause the device to emulate the set of user devices, cause the device to:
   stagger emulated actions of the set of user devices to establish a particular traffic flow.

17. The non-transitory computer-readable medium of claim 15, wherein the one or more instructions, that cause the device to determine the analog gain, cause the device to:
   determine the analog gain such that adjustments to the set of digital gains does not cause a digital gain to be outside of an available range of digital gains.

18. The non-transitory computer-readable medium of claim 15, wherein the one or more instructions, that cause the device to determine the set of calibration parameters, cause the device to:
   determine a nominal digital gain of a physical channel for the load test.

19. The non-transitory computer-readable medium of claim 15, wherein the set of calibration parameters include an average long-term gain for a physical uplink channel.

20. The non-transitory computer-readable medium of claim 15, wherein the one or more instructions, that cause the device to determine the set of calibration parameters, cause the device to:
   determine a converged long-term gain range such that the converged long-term gain is in a middle of a dynamic range.

* * * * *